US012228340B2

United States Patent
Zaidat et al.

(10) Patent No.: US 12,228,340 B2
(45) Date of Patent: Feb. 18, 2025

(54) COLD CRUCIBLE

(71) Applicants: INSTITUT POLYTECHNIQUE DE GRENOBLE, Grenoble (FR); CENTRE NATIONAL DE LA RECHERCHE SCIENTIFIQUE, Paris (FR); UNIVERSITE GRENOBLE ALPES, Saint Martin d'Heres (FR)

(72) Inventors: Kader Zaidat, Saint Martin d'Heres (FR); Christian Garnier, Eybens (FR); Ghatfan Hasan, Saint Martin d'Heres (FR)

(73) Assignees: INSTITUT POLYTECHNIQUE DE GRENOBLE, Grenoble (FR); CENTRE NATIONAL DE LA RECHERCHE SCIENTIFIQUE, Paris (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 663 days.

(21) Appl. No.: 17/429,228

(22) PCT Filed: Feb. 6, 2020

(86) PCT No.: PCT/EP2020/053046
§ 371 (c)(1),
(2) Date: Aug. 6, 2021

(87) PCT Pub. No.: WO2020/161264
PCT Pub. Date: Aug. 13, 2020

(65) Prior Publication Data
US 2022/0136771 A1  May 5, 2022

(30) Foreign Application Priority Data
Feb. 7, 2019 (FR) ........................ 1901243

(51) Int. Cl.
*F27B 14/10* (2006.01)
*C30B 35/00* (2006.01)
(Continued)

(52) U.S. Cl.
CPC ............ *F27B 14/10* (2013.01); *C30B 35/002* (2013.01); *H05B 6/24* (2013.01); *H05B 6/42* (2013.01); *F27B 2014/108* (2013.01)

(58) Field of Classification Search
CPC ...... F27B 14/10; F27B 2014/108; H05B 6/24; H05B 6/42; C30B 35/002; C30B 15/14; C30B 15/10; C30B 15/30; C30B 29/06
(Continued)

(56) References Cited

U.S. PATENT DOCUMENTS 2,811,418 A   10/1957  Theuerer
3,069,241 A   12/1962  Sterling et al.
(Continued)

FOREIGN PATENT DOCUMENTS

| DE | 10042151 A1 | 3/2002 |
| JP | 1152095 | 2/1999 |
| JP | 1152095 A | 2/1999 |

OTHER PUBLICATIONS

International Search Report and Written Opinion issued in corresponding International Application No. PCT/EP2020/053046, dated Feb. 26, 2020, pp. 1-10, European Patent Office, Rijswijk, Netherlands.
(Continued)

*Primary Examiner* — Jessee R Roe
*Assistant Examiner* — Michael Aboagye
(74) *Attorney, Agent, or Firm* — HAUPTMAN HAM, LLP

(57) ABSTRACT

A cold crucible usable in the field of high-temperature production of monocrystalline materials. The cold crucible
(Continued)

includes: a cold cage which has sectors made of a material having good electrical conductivity and in which a charge is melted, and a cooling device with heat transfer fluid, configured to cool each segment of the cold cage from the inside. The cold crucible is essentially such that it further includes at least one device for generating a static magnetic field, each generating device being housed inside one of the sectors of the cold crucible. Each static magnetic field thus generated having the effect of slowing down the electromagnetic stirring of the molten charge, such that it is possible to produce monocrystalline ingots of significantly larger diameter than the diameter of the seed initiating their growth.

16 Claims, 7 Drawing Sheets

(51) Int. Cl.
 *H05B 6/24* (2006.01)
 *H05B 6/42* (2006.01)
(58) Field of Classification Search
 USPC ........................................................ 266/275
 See application file for complete search history.

(56) References Cited

U.S. PATENT DOCUMENTS

| | | | |
|---|---|---|---|
| 3,162,710 A * | 12/1964 | Anderson | F27B 14/10 |
| | | | 266/275 |
| 4,049,384 A | 9/1977 | Wenckus et al. | |
| 4,432,093 A * | 2/1984 | Reboux | F27B 14/063 |
| | | | 219/630 |
| 4,572,812 A | 2/1986 | Ciszek | |
| 4,609,425 A | 9/1986 | Mateika et al. | |
| 4,610,017 A | 9/1986 | Perrier de la Bathie et al. | |
| 4,761,528 A | 8/1988 | Caillaut et al. | |
| 5,109,389 A | 4/1992 | Stenzel | |
| 5,991,328 A * | 11/1999 | Choudhury | F27B 14/063 |
| | | | 373/158 |
| 7,167,501 B2 * | 1/2007 | Roberts | H05B 6/24 |
| | | | 373/138 |
| 7,497,986 B2 * | 3/2009 | Bewlay | F01D 25/005 |
| | | | 266/201 |
| 8,673,048 B2 * | 3/2014 | Song | C22B 21/06 |
| | | | 204/557 |
| 10,965,174 B2 * | 3/2021 | Yamada | H02K 1/14 |
| 2007/0147463 A1 | 6/2007 | Roberts et al. | |

OTHER PUBLICATIONS

Wenckus et al., "Study, design and fabricate a cold crucible system", NTIS 1975, pp. 1-79.

Fischer et al., "Characterization of Silicon Grown By Cold Crucible Techniques", 1983, pp. 1-34.

Osiko et al., "Crucible-Free Methods of Growing Oxide Crystals From the Melt", Ann. Rev. Mater. Sci. 1987. 17: 101-22.

Ciszek, "Growth and Properties of [100] and [111] dislocation free silicon crystals from a cold crucible", Journal of Crystal Growth 70, 324-329, 1984.

Wenckus et al., "Growth of High Purity Oxygen-Free Silicon By Cold Crucible Techniques", Final technical report, May 18, 1980-Nov. 30, 1981, pp. 1-113.

Marshall et al., "Single Crystal Growth of Zirconia Utilizing a Skull Melting Technique", Aug. 79, pp. 1-25. Aug. 1979.

Ciszek, "Some Applications of Cold Crucible Technology for Silicon Photovoltaic Material Preparation", 1985, vol. 132, No. 4, 963-968.

Gillon et al., "Uses of intense d.c. magnetic fields in materials processing", Materials Science and Engineering A287 (2000) 146-152.

\* cited by examiner

-- Prior Art --

-- Prior Art --

COLD CRUCIBLE

The present application is a U.S. National Phase of International Application Number PCT/EP2020/053046, filed Feb. 6, 2020, which claims priority to French Application No. 1901243, filed Feb. 7, 2019.

TECHNICAL FIELD

The invention relates to the field of cold crucibles. It finds a particularly advantageous application in the field of the production of monocrystalline materials at high temperature.

In a known manner, a cold crucible comprises:
- a cage called cold cage comprising at least one sector made of material that is a good conductor of electricity, generally copper, and into which a charge to be melted is intended to be introduced, and
- a cooling device involving a heat-transfer fluid, usually water, the cooling device being configured to cool each sector of the cold cage.

Each cold crucible uses, to operate, an alternating current configured to induce, in the cold cage, an electromagnetic induction leading to the melting of the charge. Generally, said alternating current is injected into an electromagnetic induction coil surrounding the cold cage.

Each cold crucible can also be used with a device for continuously feeding the material constituting the charge.

PRIOR ART

There are several types of cold crucibles, two of which are illustrated in the appended FIGS. 1 and 2. Other types of cold crucibles exist which are not illustrated here which comprise, for example, the models called double crucible models. Regardless of the type of crucible considered, its operating principle is substantially common to the others; it is as introduced below with reference to FIGS. 1 and 2.

The cold crucible 1 and the coil 2 are placed in a sealed enclosure 5 with a controlled atmosphere, preferably free of oxygen, often filled with an inert gas such as argon, at a determined pressure.

When an alternating current is injected into the coil 2 surrounding the cold cage 10, induced currents appear in each of the cooled sectors 100 of the cage, these currents in turn produce an eddy current in the thickness of the skin, called electromagnetic skin, of a charge 20 located in the cage. These eddy currents allow to heat the charge 20, if necessary until it melts, without the cold crucible 1 heating up.

Of course, the heating of the charge being obtained by electromagnetic induction, the charge 20 must be electrically conductive. The thickness of the electromagnetic skin 21 of the charge 20 depends on the resistivity of this charge and the frequency used for the alternating current injected into the coil 2. Note that this electromagnetic skin 21 is the portion of the charge 20 located closest to the cold cage 10.

The cold crucible 1 can further be used to melt semiconductor materials. To this end, the cold crucible 1 is implemented, in a known manner, with a device for preheating the charge 20 to make it conductive. This preheating device (not shown) generally comprises a graphite cover arranged above the cold crucible 1 and optionally provided with a gas flow ventilation system configured to prevent any pollution of the charge 20 by the graphite of the cover.

The known advantages of this technology are: the levitation of the molten charge 20 which explains in particular the relative wear-resistance of the cold crucibles 1, the potential absence of external pollution (in particular by oxygen or graphite) in the materials 22 produced and a stirring of the molten charge 20 allowing the production of materials 22, and in particular of alloy, of very good homogeneity.

Cold crucibles are currently used for the production of metal alloys, for example based on Titanium, Niobium, etc. The use of cold crucibles in metallurgy has indeed become a very popular tool for its stirring quality, which allows to obtain alloys that are very homogeneous in composition. This homogeneity is ensured by virulent stirring due to the presence of a very high electromagnetic force, in particular observable in the thickness of the electromagnetic skin of the molten charge.

It only takes to cut off the alternating current circulating in the coil 2 so as to stop the levitation of the molten charge 20, while removing a plug 3 until then blocking the bottom of the cold crucible 1, as illustrated in FIG. 1, so that the molten charge flows into a mould located under the cold crucible.

With reference to FIG. 1, the use of cold crucibles 1 has also been considered to develop monocrystals, in particular semiconductor materials. This technique uses a perfectly monocrystalline seed to initiate the growth of monocrystalline ingots 22. The seed 23 is introduced into the molten charge 20 of the material to be crystallised, then the assembly made up of the seed 23 and the monocrystal 22 growing on the seed 23 and moved upwards (see FIG. 1) or downwards (see FIG. 2, and in particular the elements referenced 3 (cooled finger) and 4 (vertical translation plate)) to grow the monocrystal 22 in length, and ideally in diameter.

However, as shown by the studies mentioned below, this use is very quickly limited, in terms of growth in diameter of monocrystal 22. Indeed, the growth of monocrystal ingots 22 whose diameter would be significantly greater than that of the seed 23 allowing to initiate growth has not been obtained to date.

For example, the use of a cold crucible was tested in the 1970s, by Wenckus and al. to produce monocrystalline silicon ingots, then by Osiko and al. on oxides.

More particularly, Wenckus and al. (GROWTH OF HIGH PURITY OXYGEN-FREE SILICON BY COLD CRUCIBLE TECHNIQUES, Final technical report, 18 May 1980-30 Nov. 1981) have shown that the use of a cold crucible to produce silicon monocrystals was very relevant because it allows to have silicon monocrystals without external contamination. More particularly, Wenckus and al. have succeeded in growing a monocrystal with a much lower oxygen content than a monocrystal made conventionally with a hot silica crucible. However, the pure monocrystalline silicon ingots thus produced have a relatively small diameter (1.5 cm in diameter), comparable to the diameter of the seed used to initiate their growth.

In parallel, Osiko and al. (CRUCIBLE-FREE METHODS OF GROWING OXIDE CRYSTALS FROM THE MELT, Ann. Rev. Mater. Sci. 1987. 17: 101-22) have shown that it is possible to use cold crucibles for the growth of monocrystalline oxide ingots. However, the oxide ingots thus produced are still of a diameter comparable to the diameter of the seed used to initiate their growth. Osiko and al. hypothesised that this limitation is due to the intensity and direction of the stirring which would be detrimental to the growth of monocrystals of diameter significantly larger than the seed used. In order to overcome this problem, Osiko and al. suggests using double crucible models. In this model, a second cooled system is introduced into the region where the seed is inserted to control the direction and intensity of the flow of the molten charge. This has the immediate effect of contaminating the monocrystals produced.

Moreover, in the 1980s, Ciszek (Growth and Properties of (100) and (111) dislocation free silicon crystals from a cold crucible, Journal of Crystal Growth 70, 324-329, 1984) studied the growth of silicon monocrystals in a cold crucible for photovoltaic applications. Although he was only able to grow (like Wenckus and Osiko), monocrystalline ingots of small diameter, Ciszek nevertheless demonstrated that the photovoltaic cells obtained by this method had a better conversion efficiency than those obtained conventionally.

Finally, in the 2000s, Gillon and al. (Uses of intense d.c. magnetic fields in materials processing, Materials Science and Engineering A287 (2000) 146-152) introduced a cold crucible containing a charge of titanium in an intense static magnetic field (8T) created by a superconducting coil arranged around the cold crucible. They demonstrated that the stirring of the molten charge in the cold crucible was slowed down by the presence of the static magnetic field. Indeed, a braking force proportional to the vector product of the stirring speed of the molten charge and of the applied static magnetic field allows to stabilise the turbulences induced in the molten charge by the eddy currents.

An object of the present invention is therefore to provide a cold crucible allowing to at least partially overcome the aforementioned disadvantages. An object of the present invention is more particularly to provide a cold crucible allowing to produce monocrystalline ingots of dimensions, in particular transverse dimensions, significantly larger relative to the dimensions, in particular transverse dimensions, of the seed allowing to initiate their growth.

The other objects, features and advantages of the present invention will become apparent upon examining the following description and the accompanying drawings. It is understood that other advantages can be incorporated.

SUMMARY

To achieve this purpose, according to one embodiment, the present invention provides a cold crucible, moreover in accordance with the generic definition given in the above preamble, essentially such that it comprises at least one device for generating an electromagnetic field, each device being housed inside at least one sector of the cold cage of the cold crucible.

Each generation device is preferably configured to generate a static (or quasi-static) magnetic field.

Each generation device is more particularly configured to generate an electromagnetic field, and preferably a static magnetic field, of sufficient density to be felt by a molten charge in the cold cage, and more particularly at least, or even only, in a thickness of the electromagnetic skin of a molten charge in the cold cage. Each electromagnetic field thus has the effect of slowing down the electromagnetic stirring of the molten charge.

Therefore, the cold crucible according to the invention allows to successively produce monocrystalline ingots of a significantly larger diameter relative to the diameter of the seed allowing their growth to be initiated. Such monocrystalline ingots can be made of various conductive or semiconductor materials. Wafers cut from monocrystalline ingots of semiconductor materials thus produced can advantageously be applied in many fields, and in particular in the field of power electronics.

Each device for generating a magnetic field is more specifically configured to generate an electromagnetic field, and preferably a static magnetic field, having a density substantially greater than 0.02 T, preferably substantially greater than 0.05 T, at a distance substantially greater than 2 mm from one of its edges oriented towards the inside of the cold cage.

For example, each device for generating a magnetic field is configured to generate an electromagnetic field, and preferably a static magnetic field, having a density substantially comprised between 0.07 and 0.8 T (more preferably substantially comprised between 0.1 and 0.3 T), at a distance substantially comprised between 0.1 and 12 mm from the generation device (more preferably substantially comprised between 4 and 10 mm) from one of its edges oriented towards the inside of the cold cage.

Each generation device is more particularly housed within said at least one sector so as to be located, by one of its edges oriented towards the inside of the cold cage, at a distance substantially less than 12 mm, preferably substantially less than 9 mm, and even more preferably substantially less than 6 mm, from the molten charge in the cold crucible.

Each sector being based on a low resistive material, usually copper, serves as an (electromagnetic) shield to protect the generation device it houses. Indeed, the currents induced in the sectors thus naturally pass through the thickness of the walls, for example copper walls, of the sectors.

Furthermore, each generation device is configured in the sector which houses it so as to be cooled by the cooling device of the cold crucible. The same cooling device can ensure that a controlled temperature is maintained for the generation devices and the sectors.

According to a preferred embodiment of the invention, at least one generation device comprises at least one permanent magnet. The joint arrangement of each permanent magnet with the cooling device is then more particularly configured to ensure that the permanent magnet is maintained at a temperature that is always less, than the Curie temperature, beyond which the magnet loses its magnetisation. Preferably, each permanent magnet is more particularly such that it generates a static magnetic field with a density substantially equal to 0.8 T at a distance of 2 mm from its edges. Each permanent magnet is preferably made of a material having an electrical resistivity greater than that of the material constituting the sectors of the cold cage. Each permanent magnet is for example made of a material based on iron and/or neodymium.

According to a preferred embodiment of the invention, at least one device for generating a static magnetic field comprises a plurality of permanent magnets. The permanent magnets of each plurality are preferably arranged together so as to generate, at least towards the inside of the cold cage, a more powerful static magnetic field, in terms of magnetic field value than the static magnetic field generated by each permanent magnet taken apart. The permanent magnets of each plurality are for example arranged together in a configuration called Halbach configuration.

Optionally, the invention may further have at least any one of the following features:
    the cold cage comprising several sectors, the sectors are removable from one another. Where appropriate, the cold crucible further comprises a device for fastening and holding the sectors together, this device being configured so that the sectors fastened and held form at least part of the cold cage. According to one embodiment of the invention, the fastening and holding device comprises a base, generally made of stainless steel, configured to removably fasten therein each sector of the cold crucible so that the sectors and the base together form the cold cage. Preferably, the fastening of each sector on the base is configured to allow circulation of the heat-transfer fluid from the cooling device through the base in the sector. A seal, for example in the shape of a cylinder head gasket or of an O-ring, can optionally be arranged between the base and the sectors, or directly between the sectors and the cooling device, in particular in the absence of a base;

Preferably, at least one generation device comprises a first portion configured to generate the electromagnetic field, preferably to generate the static magnetic field, and a second portion, called support portion, configured to support the first portion of the generation device and to cooperate closely with the housing of the generation device in the sector. Preferably, the support portion of the generation device is configured to support a plurality of permanent magnets, for example arranged together according to a configuration called Halbach configuration. Alternatively, or in addition, the support is configured to form with the inner walls of its housing in the sector, and where appropriate with the first portion of the generation device that it supports, a circulation corridor for the heat-transfer fluid of the cooling device;

According to a particular embodiment, only two sectors opposite each other house a generation device as introduced above;

According to another particular embodiment, only three sectors arranged substantially in rotational symmetry of order 3 house a generation device as introduced above;

According to another particular embodiment, only four sectors arranged substantially in rotational symmetry of order 4 house a generation device as introduced above;

According to another particular embodiment, one sector out of two adjacent sectors houses a generation device as introduced above;

According to another particular embodiment, each sector houses a generation device as introduced above.

Each sector whose housing is free of a generation device can house at least one of: a ferrite-based material, a measurement probe or a device for modifying or analysing the molten charge.

The cold crucible according to the invention can be designed by integrating the generation device into a cold crucible of any existing type, including a cold crucible with a cylindrical cold cage, a cold crucible called pocket cold crucible, with or without removable sector(s) and a direct coil cold crucible.

BRIEF DESCRIPTION OF THE FIGURES

The purposes, objects, as well as the features and advantages of the invention will emerge better from the detailed description of an embodiment of the latter which is illustrated by the following accompanying drawings wherein.

Figure 1:
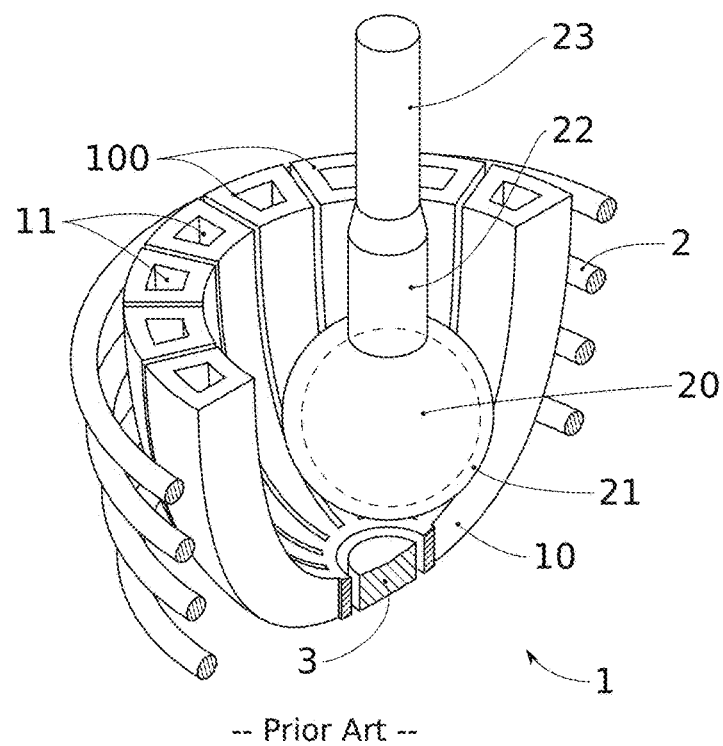
FIG. 1 schematically shows a perspective view of a cold crucible according to the prior art open in two, arranged together with an electromagnetic induction coil and comprising a charge from which a seed is gradually withdrawn to grow a monocrystal.
Figure 2:
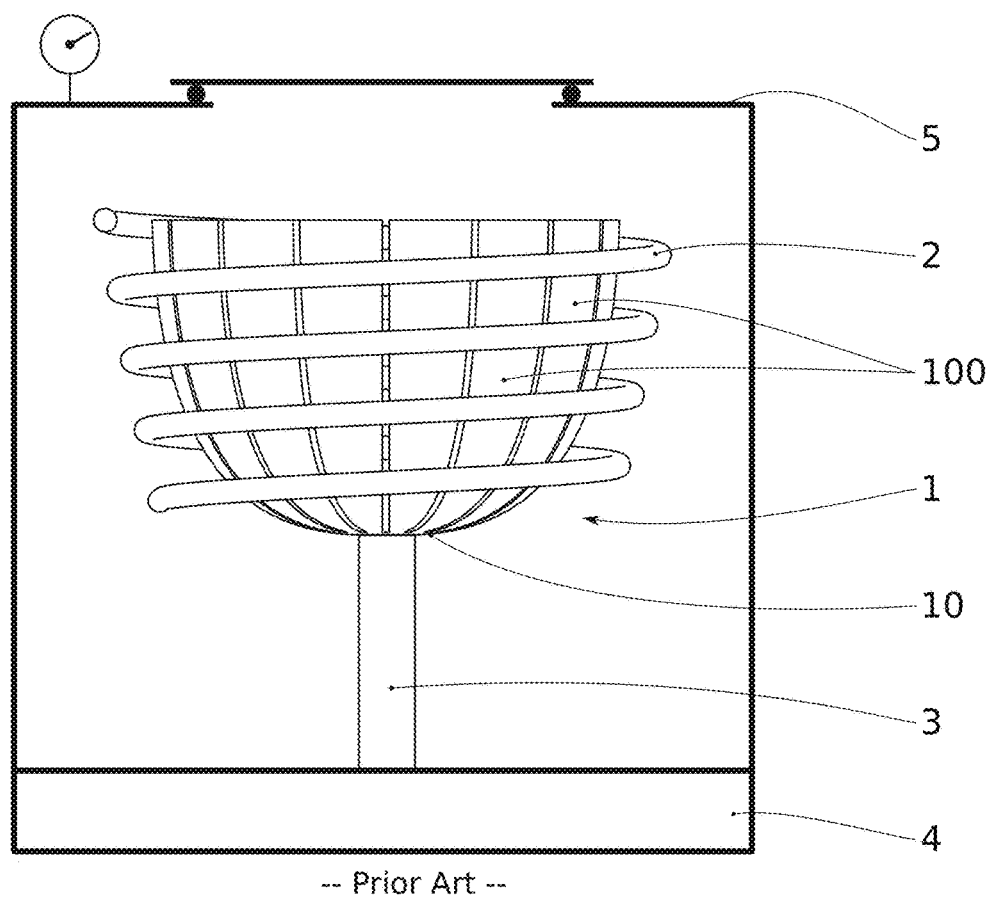
FIG. 2 schematically shows a front view in transparency of a sealed enclosure containing a cold crucible according to a prior art other than that illustrated in FIG. 1.

The drawings are given by way of example and are not limiting of the invention. They constitute schematic principle representations intended to facilitate the understanding of the invention and are not necessarily on the scale of practical applications.

DETAILED DESCRIPTION

"Less" and "greater" mean "less or equal" and "greater or equal", respectively. Equality is excluded by the use of the terms "strictly less" and "strictly greater". Also, expressions of the type "equal, less, greater" mean comparisons that can accommodate some tolerances, in particular according to the scale of the compared values and the measurement uncertainties. Values that are substantially equal, less or greater are within the scope of interpretation of the invention.

A parameter "substantially equal/greater/less than" a given value means that this parameter is equal/greater/less than the given value, to plus or minus 20%, or even 10%, close to this value. A parameter "substantially comprised between" two given values means that this parameter is at least equal to the smallest given value, plus or minus 20%, or even 10%, of this value, and at most equal to the greatest given value, plus or minus 20%, or even 10%, of this value.

It is specified that in the context of the present invention, the term "on", "surmounts", "covers" or "underlying" or their equivalents do not necessarily mean "in contact with".

"Arranged in conjunction with" means the functional relationship of two structural elements to each other where at least one is arranged according to the other element. In particular, one of the elements can be arranged according to the dimensions and shapes of the other element and/or according to a particular disposition defined in relation to an implantation of the other element, to perform together a particular function. These terms therefore aim at covering a multitude of relative arrangements of two structural elements relative to each other, a multitude that it would necessarily be futile to want to detail exhaustively.

An element based on a material A means an element comprising this material A and possibly other materials.

"Electromagnetic field" means a field represented by the set $(\vec{E},\vec{B})$, where $\vec{E}$ is the electric field and $\vec{B}$ is the magnetic field, such that a particle with charge q and speed vector $\vec{v}$ undergoes a force which is expressed by:

$$\vec{F}=q(\vec{E}+[\vec{v} \wedge \vec{B}])$$

The definition of an electromagnetic field here comprises that of a magnetic field, and a fortiori that of a static magnetic field, which constitute particular cases of an electromagnetic field.

Halbach configuration means a special arrangement of permanent magnets that increase the magnetic field on one side of the arrangement while almost cancelling the field on the other side.

A material that is a good conductor of electricity means a material whose electrical resistivity is substantially less than $6 \cdot 10^{-8}$ ohm·m, preferably substantially less than $2 \cdot 10^{-8}$ ohm·m.

As established by the inventors of the present invention, when using a conventional cold crucible for producing materials from a molten charge 20, instabilities occur in the molten charge 20. These instabilities are the consequence of intense stirring due to the Lorentz force which can have drastic consequences on the material produced. As will become apparent upon reading the detailed description which follows, the invention provides a cold crucible adapted to mitigate the aforementioned instabilities in the molten charge and for removing their consequences, in particular in terms of size limitation, on the material produced.

Figure 3:
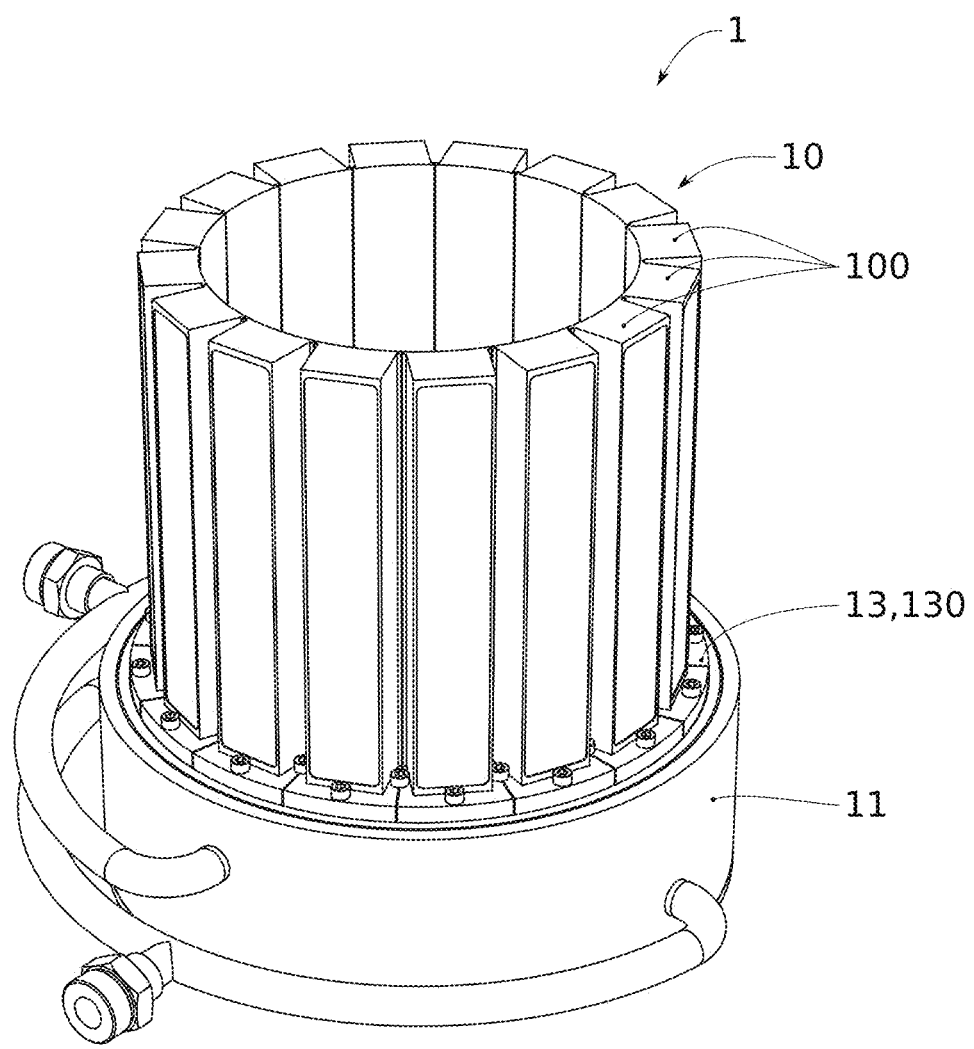
FIG. 3 shows a perspective view of a preferred embodiment of the cold crucible according to the invention equipped with a cooling device.

For this purpose, the invention more particularly provides a cold crucible 1, as for example illustrated in FIG. 3, which, unlike a conventional cold crucible, further comprises a device 12 for generating an electromagnetic field, preferably a device 12 for generating a static magnetic field, housed within at least one sector 100 of the cold cage 10 of the cold crucible 1.

A preferred embodiment of the invention is described below with reference to FIGS. 3 to 7.

The cold crucible 1 illustrated in FIG. 3 comprises a cold cage 10 of substantially cylindrical shape delimiting an inner space intended to receive a charge to be melted. The cold cage 10 more particularly consists of at least a plurality of sectors 100. In a known manner, the sectors 100 are not in electrical conduction with each other through at least part of their longitudinal edges. On this portion, an air gap can be formed between two adjacent sectors. Alternatively, each slot between two adjacent sectors can be filled with a magnetic insert. Such an insert can more particularly be made of a soft magnetic composite material.

Each sector 100 of the cold crucible 1 illustrated in FIG. 3 is fastened by a base 130, acting as a fastening and holding device 13 of the sectors 100. More particularly, the device 13 allows to fasten the sectors 100 on a cooling device 11 and allows to maintain the sectors 100 in a specific position relative to each other on the cooling device 11. Thus fastened and held, the sectors 100 form the main portion of the cold cage 11. Alternatively, the segments can share together a same base 130 on which they would be fastened and held, the base being in turn fastened to the cooling device 11.

The cold crucible 1 illustrated in FIG. 3 therefore comprises a cooling device 11 of the heat-transfer fluid type, for example water. Such a cooling device 11 may be as known from the prior art. The cold crucible 1 according to the invention may therefore not require the development or even the adaptation of known cooling devices 11 which can therefore advantageously be used as is.

Figure 4:
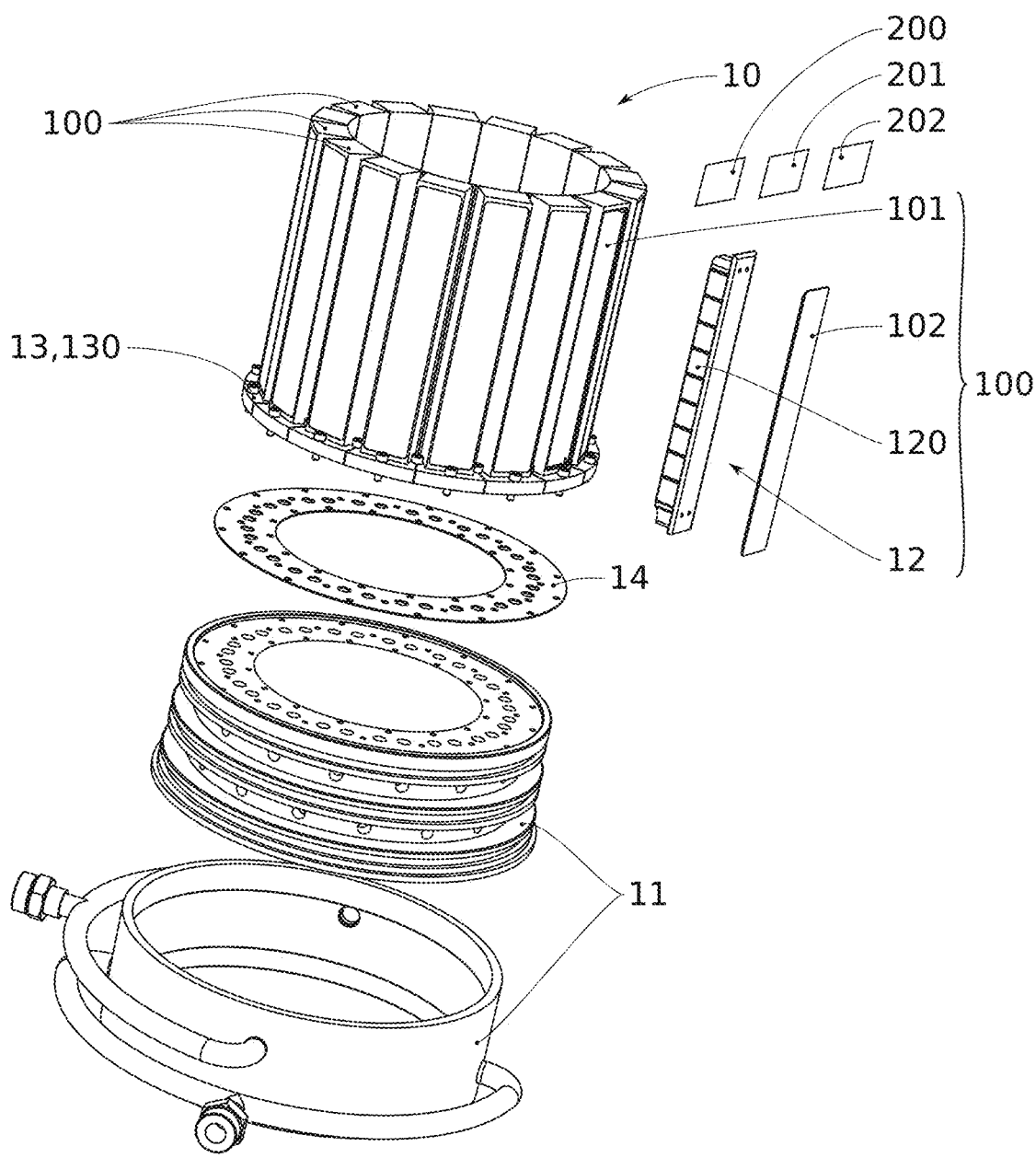
FIG. 4 is a perspective and exploded view of the cold crucible and the cooling device illustrated in FIG. 3.

As illustrated in FIG. 4, the cooling device 11 can comprise two portions. A first portion (at the bottom of FIG. 4) through which the heat-transfer fluid is introduced into, then extracted from, a second portion of the cooling device 11 defining one or more circulation circuits passing in part inside the sectors 100 to cool them.

A seal 14, here in the shape of a cylinder head gasket, may be disposed between the second portion of the cooling device 11 and each base 130, so as to ensure a sealing between these parts. As an alternative, the sectors may extend by their base 130 through an inlet and an outlet of the heat-transfer fluid each projecting from the flat surface of the base 130 and each being intended to be inserted into corresponding bores of the cooling device or an intermediate portion (not shown) between the cooling device and all the sectors 100. The sealing between each sector 100 and the cooling device 11 can then be achieved by one or more O-rings distributed along the projections of inlet and outlet of the heat-transfer fluid.

In FIG. 4, a partially exploded view of the cold cage 10 is also shown. The sectors 100 are fastened together by their base 130. More particularly, one of the sectors 100 is illustrated in an exploded view. Thus it appears that each sector 100 can include a housing 101 within which the generation device 12 is housed.

More particularly, the housing 101 can be closed, preferably by its side opposite the inner space of the cold cage 10, by a plate 102, made of brass or copper, fastened, preferably by welding, so as to be in electrical conduction with the other walls defining the housing 101. Such a design may be the consequence of a recess of a sector of a conventional cold crucible in order to form the housing 101 therein and to be able to house the generation device 12 therein. A conventional cold crucible indeed only comprises a portion of the heat-transfer fluid circulation channel intended to allow its cooling; it is therefore a priori not allowed to house any device therein, here a generation 12 device, at least not without affecting the cooling of the sector. As an alternative, each sector 100 may have been designed so as to have its own housing 101 intended to receive a generation device 12.

Figure 5:
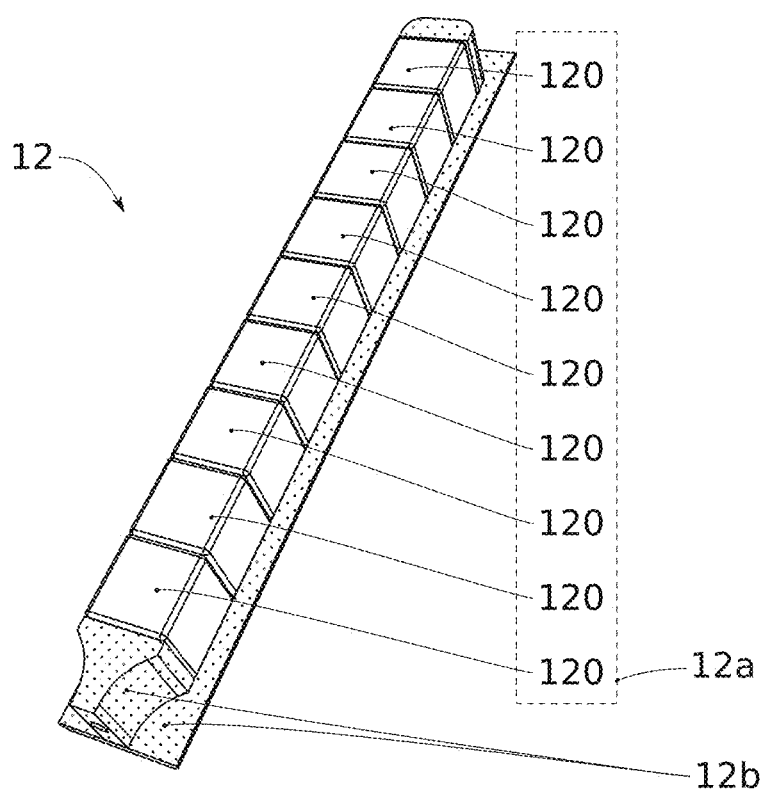
FIG. 5 is a perspective view of a static magnetic field generating device according to the preferred embodiment of the invention.

The generation device 12 as illustrated in FIG. 4 is more particularly represented in FIG. 5. This figure illustrates in particular the fact that, according to the preferred embodiment of the invention, the generation device 12 essentially comprises two portions 12a and 12b. A first portion 12a is configured to generate the static magnetic field. A second portion, called the support portion 12b, is configured to support the first portion 12a of the generation device 12. More particularly, the support portion 12b comprises a substantially longitudinal plate from which two support elements extend. The first portion 12a of the generation device is fastened and held between the two holding elements of the support portion 12b. The two holding elements are further configured so as to reserve a portion of the heat-transfer fluid circulation circuit in the sector 100, and more particularly in the space of the housing 101 unoccupied by the generation device 12, around the first portion 12a of the generation device 12. Thus, a first one of the two holding elements (the lower one in FIG. 5) constitutes a type of central island on either side of which the heat-transfer fluid is intended to flow in opposite directions; the second one of the two holding elements (the one at the top of FIG. 5) forms the interior of a meander in the circulation circuit.

Figure 6:
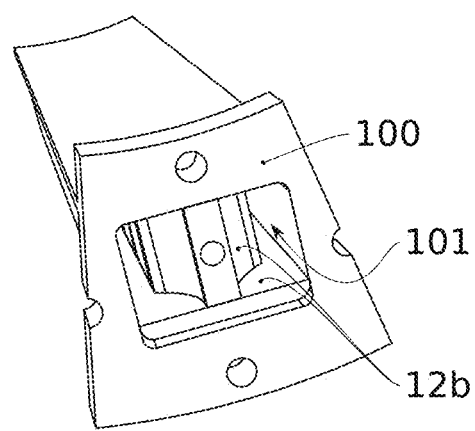
FIG. 6 is a perspective view from below of a sector according to the preferred embodiment of the invention.

A perspective bottom view of one of the sectors 100 illustrated in FIG. 3 is illustrated in FIG. 6. It illustrates that the housing 101 is open by its base 130. A series of through bores and/or material setbacks may be provided in extensions of the base 130 for fastening to bases of adjacent sectors and/or for fastening to the cooling device 11 through the cylinder head gasket 14. More particularly, the material setbacks of two segments 100 adjacent to each other may be intended to cooperate together for the purpose of fastening these segments together. It is also illustrated in FIG. 6 that the generation device 12 is housed tightly within the housing 101. In particular, the second portion 12b comprises a longitudinal plate configured to preferably cover the entire inner surface of the housing 101 which is oriented towards the inner space of the cold cage 10; and the surface of the first portion 12a of the generation device 12 is bearing, or at least in contact, with the inner surface of the housing 101 which is oriented towards the inner space of the cold cage 10. In this way, any movement of the generation device 12 in its housing 101 is avoided, which is therefore held stationary therein. Thus, it also appears that the assembly formed of the sector 100 and of the generation device 12 suitably placed in the sector 100 defines the aforementioned U-shaped portion of the circulation circuit opening out through the base 130 of the sector 100. It is noted that, in this configuration, the first portion 12a of the generation device 12, configured to generate the static magnetic field, is located as close as possible to the inner space of the cold cage 10. More particularly, only the thickness of the longitudinal wall of the sector 100 which is oriented towards the inner space of the cold cage 10 separates the first portion 12a of the generation device 12 and the inner space of the cold cage 10. The thickness of this wall is for example comprised between 0.5 and 2 mm, preferably comprised between 0.7 and 1.5 mm.

It will be understood that the generation device 12 is thus more particularly housed within its sector 100 so as to be located, by its edge oriented towards the inside of the cold cage 10, at a distance substantially less than 12 mm, preferably substantially less than 9 mm, and even more preferably substantially less than 6 mm, from the molten charge 20 in the cold crucible 1.

Furthermore, it appears that, by construction, the generation device 12 is configured so as to be cooled by the cooling device 11 already in charge of cooling the sector 100 within which the generation device 12 is housed.

Figure 7:
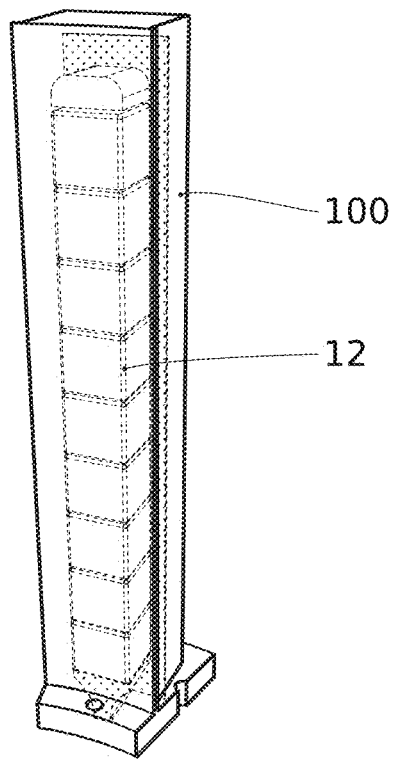
FIG. 7 is a perspective view in transparency of the sector illustrated in FIG. 6.

The first portion 12a of the generation device 12 according to the preferred embodiment of the invention is described below with reference to FIGS. 5 and 7.

As illustrated, the first portion 12a of the generation device 12 comprises, without limitation, a plurality of nine permanent magnets 120. Therefore, it is understood that the cooling device 11 is preferably configured and/or parameterised to guarantee maintaining each permanent magnet at a temperature strictly below the Curie temperature of this magnet; otherwise, the magnetisation of the permanent magnet would be lost.

Figure 8:
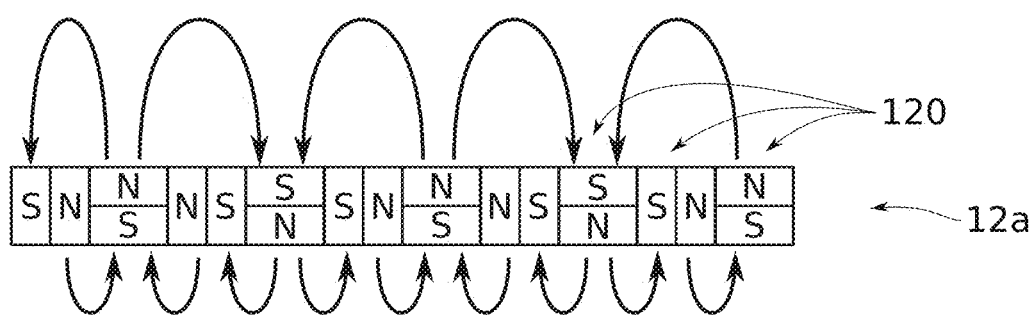
FIG. 8 is a schematic representation of an arrangement of permanent magnets in a Halbach configuration and the isomagnetic lines produced by this arrangement.

Each permanent magnet may have a substantially cubic geometry, the ridges of which are for example substantially equal to 2 cm. Of course, the geometry and the dimensions of each permanent magnet must be adapted to the dimensions of the housing 101, and more generally of the sector 100. Each permanent magnet 120 can more particularly be made from a neodymium/iron/boron alloy. Such an alloy has an electrical resistivity greater, and more particularly at least twice greater, than that of the copper constituting the sectors 100 of the cold cage 10. The permanent magnets 120 are aligned with each other and kept aligned by and between the two elements for holding the support portion 12b of the generation device 12. This alignment is more particularly such that the permanent magnets 120 are arranged together in a configuration called Halbach configuration. Such a configuration is known to allow, as illustrated in FIG. 8, to generate, in a direction perpendicular to the alignment, a more powerful static magnetic field than in another direction perpendicular to the alignment.

The arrangement of the alignment on the support portion correlates with the expected disposition of the generation device 12 in the housing 101 of its sector. More particularly, the generation device 12 is disposed in its housing 101 so that the side by which the alignment of the permanent magnets generates a more powerful static magnetic field is located directly facing, and preferably in contact with, the longitudinal wall of the sector 100 which is oriented towards the inner space of the cold cage 10.

With permanent magnets such as those introduced above as an example, the magnetic field generated by the Halbach alignment has a maximum density at 2 mm substantially equal to 0.6 T and still has a maximum density at 12 mm substantially equal to 0.1 T.

It is therefore understood that, in particular according to this particular arrangement, the generation device 12 is configured to generate a static magnetic field of sufficient density to be felt by the molten charge 20 in the cold cage 10, and more particularly at least in a thickness of the electromagnetic skin 21 of the molten charge in the cold cage.

More particularly, the static magnetic field generated by the generation device 12 is such that it has a density substantially greater than 0.02 T, preferably substantially greater than 0.05 T, at a distance substantially greater than 2 mm from its edge oriented towards the inside of the cold cage 10.

As an alternative or in addition, the static magnetic field generated by the generation device 12 is such that it has a density substantially comprised between 0.07 and 0.8 T at a distance substantially comprised between 0.1 and 12 mm from its edge oriented towards the inside of the cold cage 10. Preferably, the static magnetic field generated by the generation device 12 is such that it has a density substantially comprised between 0.1 and 0.3 T at a distance substantially comprised between 4 and 10 mm, from one of the edges of the generation device oriented towards the inside of the cold cage 10.

Figure 9:
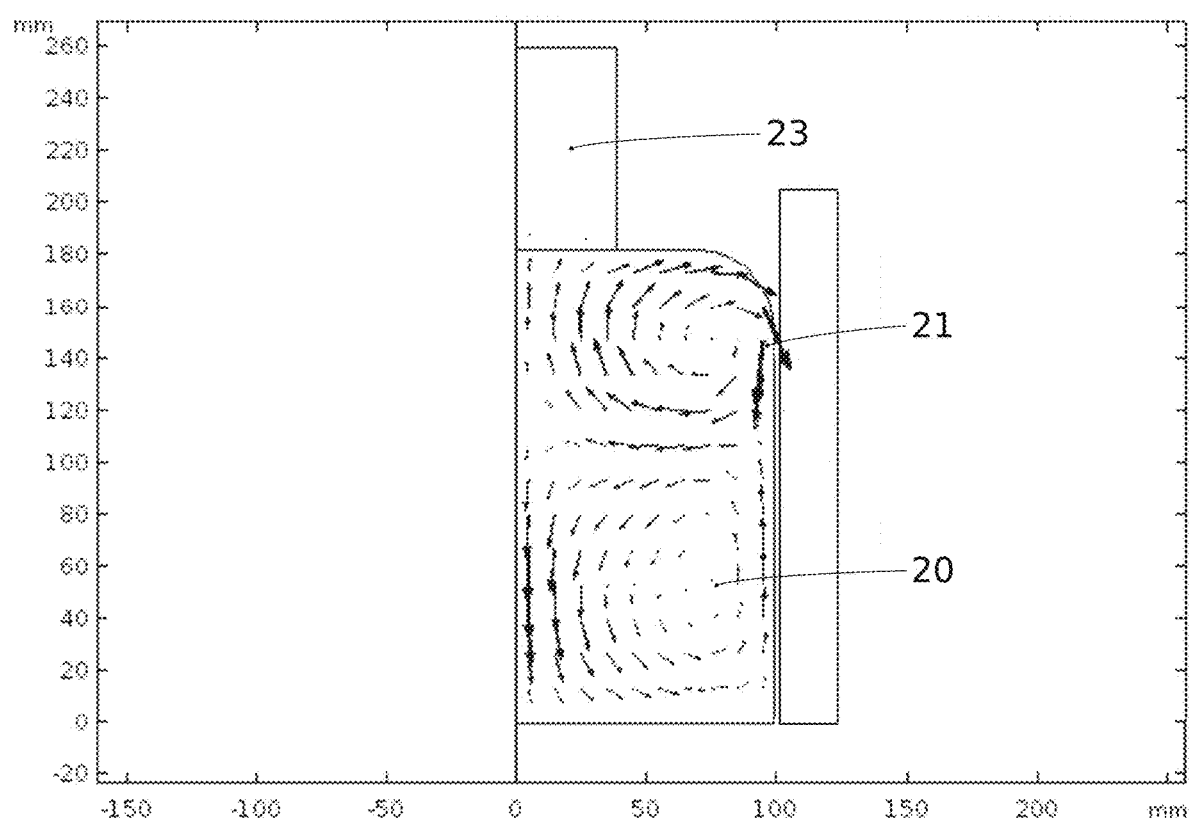
FIGS. 9 and 10 are simulation results of a multi-physics model demonstrating the efficiency of the cold crucible according to the invention (FIG. 10) relative to that of a cold crucible according to the prior art (FIG. 9).
Figure 10:
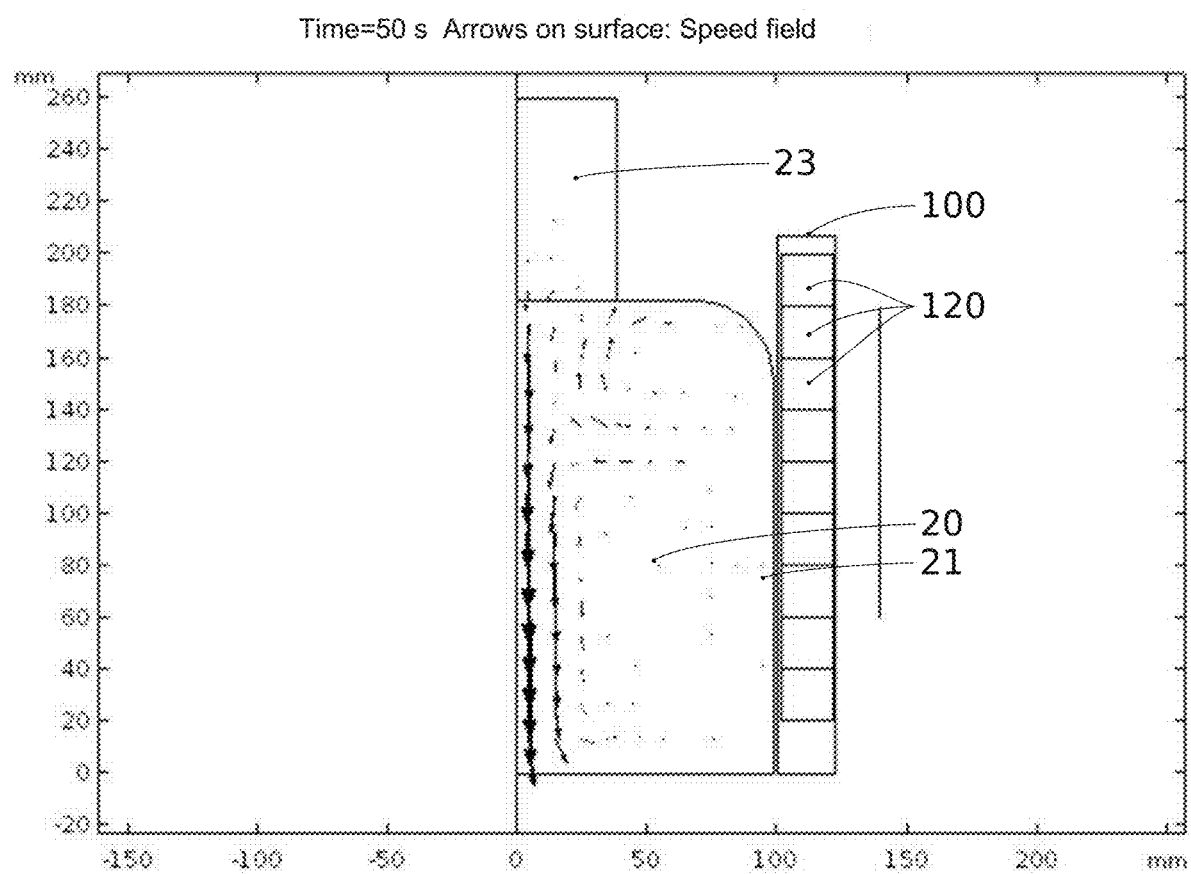

A multi-physical digital model has been developed which allows to show the efficiency of the cold crucible according to the invention. FIG. 10 shows that the use of the permanent magnets 120 in the sectors 100 significantly modifies the flow of the molten charge 20 (in the simulation, the material is brought to a temperature substantially equal to 1690° C.) in the cold crucible 1. This modification results in an intense braking of the stirring speeds in the areas of the molten charge 20 closest to the cold crucible 1, but also by a reversal of the stirring vortices, the latter adopting a direction of rotation more favourable to the growth of a monocrystal from a seed 23 than in a conventional cold crucible (FIG. 9).

The cold crucible according to the invention therefore allows on the one hand to slow down the stirring which would be observed in a conventional cold crucible, on the other hand to reverse the direction of recirculation of the vortices induced in the molten charge 20.

The use of a "magnetic" cold crucible according to the invention allows, in particular by synergy of the two technical effects set out above, to promote the growth of monocrystals of larger size than a conventional cold crucible. More particularly, the use of a "magnetic" cold crucible according to the invention allows to promote the growth of monocrystals of larger diameter than the diameter of the seed initiating growth and of better quality than that obtained by the techniques using hot crucibles.

Another advantage related to the use of "magnetic" cold crucibles according to the invention appears when considering a charge made of different materials with differences in magnetic susceptibility between them. For example, such a charge can comprise ferromagnetic, paramagnetic or diamagnetic materials. A "magnetic" cold crucible according to the invention can then allow, due to the presence of a static magnetic field gradient extending into the molten charge 20, a selective sorting of these materials.

Other advantages can be achieved through the use of a cold crucible according to the invention, in particular by integration inside sectors whose housings are not occupied by generation devices 12 and/or allow to house at least one of: a ferrite-based material 200, a measurement probe 201 or a device 202 allowing to modify or analyse the molten charge. The device allowing to modify or analyse the molten charge may in particular allow to modify or analyse at least one property of the molten charge, such as the flow of the charge. In a non-limiting manner, this device can comprise at least one of a device for generating an electromagnetic field, preferably a permanent magnet, a ferrite, an ultrasonic transducer and a piezoelectric device. The flow of the charge can in particular be slowed down, for example by an electromagnetic field, and/or its stirring can be accentuated, for example by ultrasound.

Other advantages can also be achieved through the use of a cold crucible according to the invention, in particular by the arrangement therebetween of the sectors 100 housing generation devices 12. The sectors 100 can indeed be arranged in one of the following ways:
- only two sectors opposite each other house a generation device;
- only three sectors arranged substantially in rotational symmetry of order 3 house a generation device;
- only four sectors arranged substantially in rotational symmetry of order 4 house a generation device;
- one sector out of two adjacent sectors houses a generation device; and
- each sector houses a generation device.

In addition to the production of oxide monocrystals, such as sapphire, the cold crucible according to the invention allows to produce monocrystal silicon ingots of large dimensions, and in particular of large diameter, in particular intended for applications in the field of power electronics.

The invention is not limited to the embodiments described above and extends to all the embodiments covered by the claims.

In particular, the cold crucible 1 according to the invention can be designed by integrating the generation device 12 into a cold crucible of any existing type, including a cold crucible with a cylindrical cold cage, a cold crucible called pocket cold crucible, with or without removable sector(s), and a cold crucible called direct coil cold crucible.

A direct coil cold crucible consists of a single sector substantially forming a cylinder into which is injected the alternating current configured to induce, in the cold cage, an electromagnetic induction leading to the melting of the charge. Here, the sector therefore itself acts as the electrical coil which is usually arranged around the cold cage; hence its name "direct coil". The sector can be made of copper or another metal. The cooling device of this type of crucible can be, as described above, of the type with a circulation channel for heat-transfer fluid. It is usually brazed directly on the outer surface of the cylinder that the single sector forms. Alternatively, the cylinder can be formed of a double wall housing the cooling device. The current injected into this cylinder produces induced currents directly in the charge and when the latter is liquid, it is contained in the cylinder. This technique is really interesting for large cold crucible sizes, such a crucible typically having a diameter of around 40 cm.

Thus, it is understood that, if the description of the invention given above with reference to the figures relates to cold crucibles comprising a plurality of sectors, the invention is not however limited to such cold crucibles, and extends to the cold crucible having a single sector. At least one generation device can then be housed within a protuberance of the cylinder or in the middle of the double wall, for example by extending between two meanders of the heat-transfer fluid circulation channel intended to allow cooling of the sector.

Moreover, each generation 12 device is not limited to its embodiment comprising at least one permanent magnet. Indeed, it is for example conceivable, although not preferred for reasons of electrical connection difficulties in particular, that the field is electromagnetic and can be generated by at least one electromagnet. Since the supply current of such an electromagnet can vary over time causing the magnetic field generated by this electromagnet to vary, it is understood that the electromagnetic field generated by a generation device 12 in a cold crucible according to the invention is not necessarily limited to a static magnetic field; in particular, the electromagnetic field generated by the generation device 12 can be a quasi-static magnetic field.

The invention claimed is:

1. A cold crucible comprising: a cage called cold cage comprising at least one sector made of material that is a conductor of electricity and into which a charge to be melted is to be introduced, and a cooling device comprising a heat-transfer fluid, the cooling device being configured to cool each sector of the cold cage, wherein the cold crucible further comprises at least one generation device for generating an electromagnetic field, each generation device being housed inside said at least one sector of the cold cage of the cold crucible, and wherein the electromagnetic field generated by the at least one generation device is such that it has a density substantially greater than 0.02 T, at a distance substantially greater than 2 mm from an edge of the at least one generation device oriented towards the inside of the cold cage.

2. The cold crucible according to claim 1, wherein the at least one generation device is configured to generate a static magnetic field.

3. The cold crucible according to claim 1, wherein the at least one generation device is configured to generate an electromagnetic field of sufficient density to be felt by the molten charge in the cold cage.

4. The cold crucible according to claim 1, wherein the at least one generation device is housed within said at least one sector so as to be located, by the edge oriented towards the inside of the cold cage, at a distance substantially less than 12 mm from the molten charge in the cold crucible.

5. The cold crucible according to claim 1, wherein the at least one generation device is housed in said at least one sector and is configured so as to be cooled by the cooling device of the cold crucible.

6. The cold crucible according to claim 1, wherein the at least one generation device comprises at least one permanent magnet.

7. The cold crucible according to claim 5, wherein, the at least one generation device comprises at least one permanent magnet, and the cooling device is configured to maintain that the at least one permanent magnet at a temperature strictly less than the Curie temperature of the at least one permanent magnet.

8. The cold crucible according to claim 6, wherein said at least one permanent magnet is made of a material having an electrical resistivity greater than that of the material constituting the sectors of the cold cage.

9. The cold crucible according to claim 1, wherein at least one generation device comprises a plurality of permanent magnets, the plurality of permanent magnets being arranged together so as to generate, at least towards the inside of the cold cage, a more powerful static magnetic field than the static magnetic field generated by each permanent magnet taken apart.

10. The cold crucible according to claim 9, wherein the plurality of permanent magnets are arranged together in a configuration called Halbach configuration.

11. The cold crucible according to claim 1, wherein the cold crucible further comprises a device for fastening and holding the sectors together, said device being configured so that the sectors fastened and held form at least part of the cold cage.

12. The cold crucible according to claim 1, wherein a support portion of the at least one generation device is configured to support a plurality of permanent magnets and to form with inner walls of a housing of the at least one sector a circulation corridor for the heat-transfer fluid of the cooling device.

13. The cold crucible according to claim 1, wherein the cold cage comprises the at least one sector comprises several sectors and the sectors of which are arranged in one of the following ways:
   only two sectors opposite each other house a generation device;
   only three sectors arranged substantially in rotational symmetry of order 3 house a generation device;
   only four sectors arranged substantially in rotational symmetry of order 4 house a generation device;
   one sector out of two adjacent sectors houses a generation device; or
   each sector houses a generation device.

14. The cold crucible according to claim 1, wherein with the cold cage comprising several sectors, the sectors are removable from one another.

15. The cold crucible according to claim 1, wherein the at least one generation device comprises a first portion configured to generate the electromagnetic field and a second portion, called support portion configured to support the first portion of the at least one generation device and to cooperate closely with the housing of the at least one generation device in said at least one sector.

16. A cold crucible comprising:
   a cage called cold cage comprising at least one sector made of material that is a conductor of electricity, and into which a charge to be melted is to be introduced, and
   a cooling device involving a heat-transfer fluid, the cooling device being configured to cool
   each sector of the cold cage,
   wherein the cold crucible further comprises at least one device for generating an electromagnetic field, each generation device being housed inside at least one sector of the cold cage of the cold crucible; and
   wherein each sector whose housing is free of a generation device houses at least one among: a ferrite-based material, a measurement probe or a device for modifying or analysing the molten charge.

* * * * *